United States Patent
Hong et al.

(10) Patent No.: US 9,214,514 B2
(45) Date of Patent: Dec. 15, 2015

(54) MECHANISMS FOR FORMING SEMICONDUCTOR DEVICE HAVING STABLE DISLOCATION PROFILE

(71) Applicant: TAIWAN SEMICONDUCTOR MANUFACTURING CO., LTD, Hsin-Chu (TW)

(72) Inventors: Min-Hao Hong, Kaohsiung (TW); Shiu-Ko Jangjian, Tainan (TW); Chih-Tsung Lee, Hsinchu (TW); Miao-Cheng Liao, Tsztung Shiang (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/080,220

(22) Filed: Nov. 14, 2013

(65) Prior Publication Data

US 2015/0132913 A1  May 14, 2015

(51) Int. Cl.
| | |
|---|---|
| *H01L 21/336* | (2006.01) |
| *H01L 21/70* | (2006.01) |
| *H01L 21/8238* | (2006.01) |
| *H01L 27/085* | (2006.01) |
| *H01L 27/092* | (2006.01) |
| *H01L 29/08* | (2006.01) |
| *H01L 29/66* | (2006.01) |
| *H01L 29/78* | (2006.01) |

(52) U.S. Cl.
CPC ...... *H01L 29/0847* (2013.01); *H01L 29/66636* (2013.01); *H01L 29/7848* (2013.01)

(58) Field of Classification Search
CPC ..... H01L 27/12; H01L 21/336; H01L 27/092; H01L 21/782
USPC ............ 257/347, 410, 77; 438/154, 229, 778, 438/795, 478, 151
See application file for complete search history.

(56) References Cited

U.S. PATENT DOCUMENTS

| | | | | |
|---|---|---|---|---|
| 4,797,718 | A * | 1/1989 | Schubert ................... | 257/387 |
| 2005/0029601 | A1* | 2/2005 | Chen et al. ................ | 257/369 |
| 2006/0145273 | A1* | 7/2006 | Curello et al. ............. | 257/410 |
| 2011/0187868 | A1* | 8/2011 | Chang et al. .............. | 348/163 |
| 2012/0261672 | A1* | 10/2012 | Chidambarrao et al. ........ | 257/77 |
| 2013/0146949 | A1* | 6/2013 | Tsai et al. ................ | 257/288 |
| 2013/0228862 | A1* | 9/2013 | Lee et al. ................. | 257/347 |

OTHER PUBLICATIONS

U.S. Appl. No. 13/594,254, filed Aug. 24, 2012, Unknown (not yet published).

* cited by examiner

*Primary Examiner* — Kimberly Rizkallah
*Assistant Examiner* — Brian Turner
(74) *Attorney, Agent, or Firm* — Birch, Stewart, Kolasch & Birch, LLP

(57) ABSTRACT

Embodiments that relate to mechanisms for providing a stable dislocation profile are provided. A semiconductor substrate having a gate stack is provided. An opening is formed adjacent to a side of the gate stack. A first part of an epitaxial growth structure is formed in the opening. A second part of the epitaxial growth structure is formed in the opening. The first part and the second part of the epitaxial growth structure are formed along different directions.

21 Claims, 11 Drawing Sheets

US 9,214,514 B2

MECHANISMS FOR FORMING SEMICONDUCTOR DEVICE HAVING STABLE DISLOCATION PROFILE

BACKGROUND

The semiconductor integrated circuit (IC) industry has been experiencing rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices like a metal-oxide-semiconductor field-effect transistors (MOSFETs) are scaled down through various technology nodes, strained source/drain features (e.g., stressor regions) have been implemented to enhance carrier mobility and improve device performance. Stress distorts or strains the semiconductor crystal lattice, which affects the band alignment and charge transport properties of the semiconductor. By controlling the magnitude and distribution of stress in a finished device, manufacturers can increase carrier mobility and improve device performance. Although existing approaches to forming stressor regions for IC devices have been generally adequate for their intended purposes, they have not been entirely satisfactory in all respects.

BRIEF DESCRIPTION OF THE DRAWINGS

For a more complete understanding of the present disclosure, and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1:
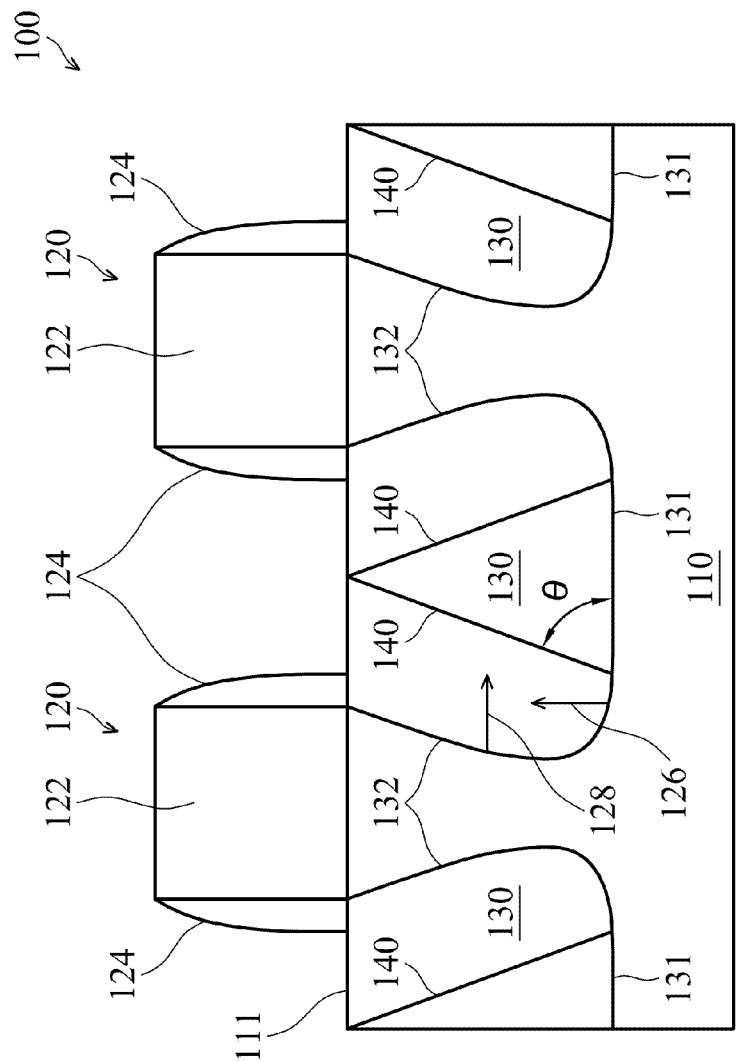
FIG. 1 shows a cross-sectional representation of a semiconductor device, in accordance with some embodiments of the disclosure.

Embodiments of mechanisms for forming a semiconductor device structure that includes dislocations are provided. FIG. 1 shows a cross-sectional representation of a semiconductor device 100 that includes dislocations, in accordance with some embodiments of the disclosure.

Referring to FIG. 1, a device 100 which is suitable for a stress-memorization technique (SMT) is provided. The device 100 includes a substrate 110 with a gate structure 120 formed on the substrate 110. Source and drain regions 130 are disposed on both sides of the gate structure 120. A channel region (not shown) exists between the source and drain regions 130.

In some embodiments, the substrate 110 may be a bulk silicon substrate. Alternatively, the substrate 110 may include an elementary semiconductor, such as silicon or germanium in a crystalline structure; a compound semiconductor, such as silicon germanium, silicon carbide, gallium arsenic, gallium phosphide, indium phosphide, indium arsenic, and/or indium antimonide; an alloy semiconductor, such as GaAsP, AlInAs, AlGaAs, GaInAs, GaInP and/or GaInAsP. The substrate 110 may be a semiconductor on insulator (SOI). The substrate 110 may include a doped epi layer, a gradient semiconductor layer, and/or a semiconductor layer overlying another semiconductor layer of a different type, such as a silicon layer on a silicon germanium layer.

The gate structure 120 includes gate material layers. In some embodiments, the gate structure 120 includes a gate stack 122, which includes one or more gate dielectric layer and a gate electrode. The gate structure 120 may further include gate spacers 124 on sidewalls of the gate stack 122. The gate structure 120 may be formed by chemical vapor deposition (CVD), physical vapor deposition (PVD), atomic layer deposition (ALD), high density plasma CVD (HDPCVD), plating, other suitable methods and/or a combination thereof.

The gate stack 122 is formed over the substrate 110 to a suitable thickness. In some embodiments, the gate stack 122 includes a polysilicon layer. The polysilicon layer may be doped for proper conductivity. Alternatively, the polysilicon layer is not necessarily doped, for example, when the polysilicon layer acts as a dummy gate and is later replaced by a gate replacement process. In other embodiments, the gate stack 122 includes a conductive layer having a proper work function, therefore, the gate stack 122 is also referred to as a work function layer. The work function layer includes a suitable material, such that the layer can be tuned to have a proper work function for enhanced performance of the device. For example, the work function layer includes Ta, TiAl, TiAlN, or TaCN if the work function layer is used for an NMOS device. In some embodiments, the work function layer includes doped conducting oxide materials. In some embodiments, the work function layer includes other conductive materials, such as aluminum, copper, tungsten, metal alloys, metal silicide, and/or other suitable materials.

In some embodiments, lightly doped source and drain (LDD) regions (not shown) are formed in the substrate 110. Portions of the LDD regions are formed under the gate structure 120. For NMOS transistors, N-type LDD regions are formed of n-type dopants, such as phosphorous, arsenic, and/or other V-group elements. In some embodiments, P-type pocket doped regions are also formed in the substrate 110.

In some embodiments, the source and drain regions 130 may be formed of an epitaxial growth material. The epitaxial growth material may include SiC, SiP, SiCP or a combination thereof, for N-type transistors. Alternatively, the epitaxial growth material includes SiGe, for P-type transistors. In some embodiments, each of the source and drain regions 130 further includes dislocations 140. In some embodiments, the dislocations 140 in the source and drain regions 130 may exert a strain stress onto the channel region of the device 100. The strain stress on the channel region enhances carrier mobility in the channel region.

In some embodiments, the dislocations 140 are formed at crystalline growth at a first direction 126 from the bottom surface 131 of the epitaxial growth material and the crystalline growth at a second direction 128 from the sidewalls 132 of epitaxial growth material, as shown in FIG. 1. The first direction 126 and the second direction 128 may be perpendicular to the bottom surface 131 and the sidewalls 132, respectively. The dislocations 140 has an angle θ, in a range from about 0 degrees to about 180 degrees, the angle θ being measured with respect to an axis parallel to a main surface 111 of the substrate 110. In some embodiments, the dislocations 140 provide a symmetrical stress to the channel region.

The dislocations 140 may be intentionally formed by performing some operations. Precisely controlling the quality of the dislocations 140 plays an important role in providing a stable improved performance of the device 100.

In some embodiments, the dislocations 140 may be formed by applying a stress to amorphized regions, for recrystallizing the amorphized regions to stressor regions while forming the dislocations 140 in the stressor regions. For example, FIG. 2 shows a cross-sectional representation of an intermediate stage of forming a semiconductor device 200 having the dislocations 140, in accordance with some embodiments of the disclosure.

Figure 2:
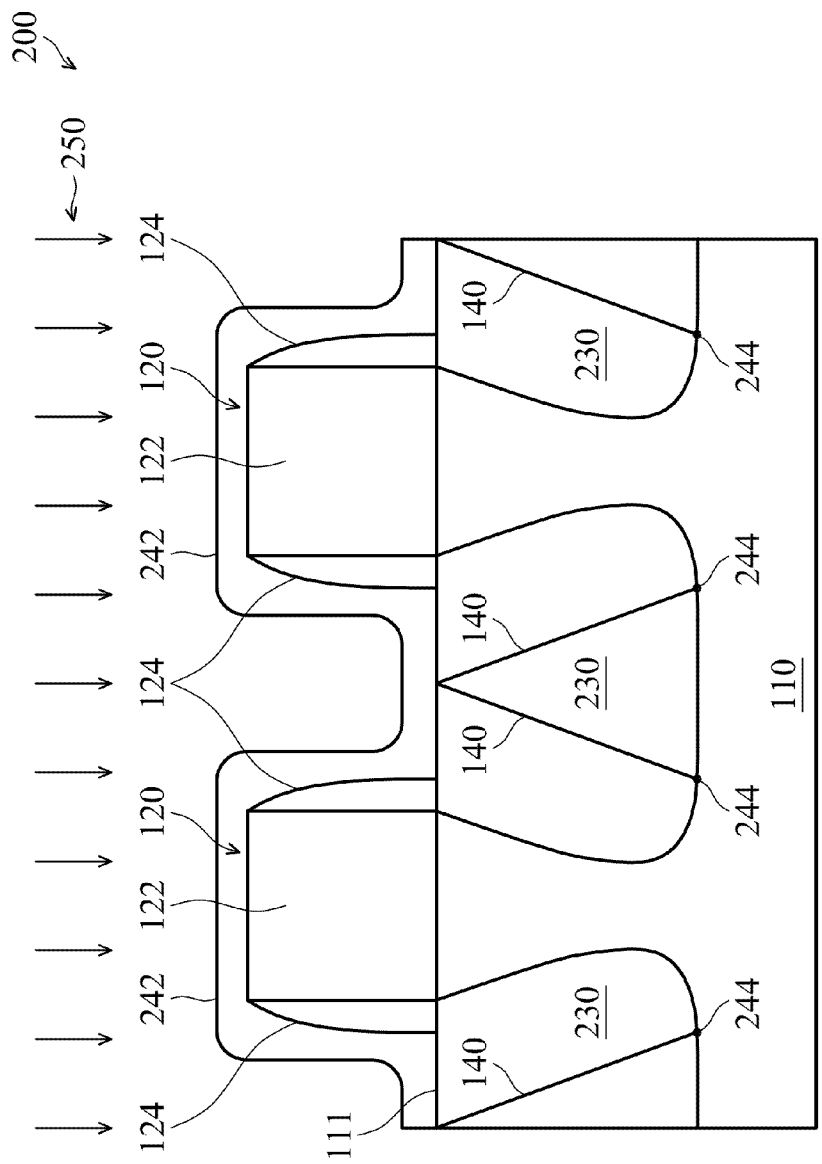
FIG. 2 shows an intermediate stage of forming a semiconductor device, in accordance with some embodiments of the disclosure.

As shown in FIG. 2, the device 200 includes the substrate 110 with the gate structure 120 formed on the substrate 110. Stressor regions 230 are formed on both sides of the gate structure 120. In some embodiments, a stress film 242 is formed over the gate structure 120 and the stressor regions 230. The stress film 242 may include a dielectric material, such as silicon nitride, silicon oxide, silicon oxynitride, other suitable materials and/or a combination thereof. The stress film 242 is capable of providing stress to the substrate 110 if suffering a thermal treatment.

In some embodiments, the stressor regions 230 are recrystallized from an amorphized phase. The amorphized phase may be formed by applying a pre-amorphous implantation (PAI) process. The PAI process implants the substrate 110 with some species, which may damage the lattice structure of the substrate 110 and form amorphized regions. For example, the PAI process may implant the substrate 110 with silicon, germanium or other implant species heavier than silicon in suitable implant energy.

The recrystallization of the amorphized regions may be caused by a thermal treatment. As shown in FIG. 2, an annealing process 250 is performed on the substrate 110 and the stress film 242. During the annealing process 250, the stress film 242 may also apply stress to the amorphized regions. The stress can affect the recrystallization process. For example, it could retard the growth rate in the first direction 126 of the stressor regions 230, and therefore induce the formation of the dislocations 140. Due to the mechanisms described above, the dislocations 140 start formation from pinchoff points 244, as shown in FIG. 2.

In some embodiments, a silicon-containing epitaxial structure (not shown) is further formed near the main surface 111 of the substrate 110. The silicon-containing epitaxial structure may be formed by etching recessed regions in each of the stressor regions 230 and then epitaxial depositing a silicon-containing epitaxial material into the recessed regions. The silicon-containing epitaxial material may include SiC, SiCP, SiP or other materials that produce tensile strain on the channel region. Alternatively, the silicon-containing material may include SiGe or other materials that produce compressive strain on the channel region. The dislocations 140 may propagate into the silicon-containing epitaxial structure the when the pinchoff points 244 are presented.

The profile of the thermal and stress-induced dislocations 140 may sometimes be not stable, such as when that are being influenced by the thickness uniformity of the stress film 242 and thermal fluctuation of the annealing process 250. Excess dislocations in other directions other than the two dislocations as shown in FIG. 2 may also be formed and result in undesired stress. Furthermore, the pinchoff points 244 are sometimes also removed during the formation of the silicon-containing epitaxial structure, especially when the stressor regions 230 have a shallow depth. The dislocations 140 would not be formed in the silicon-containing epitaxial structure in absence of the pinchoff points 244.

Figure 3:
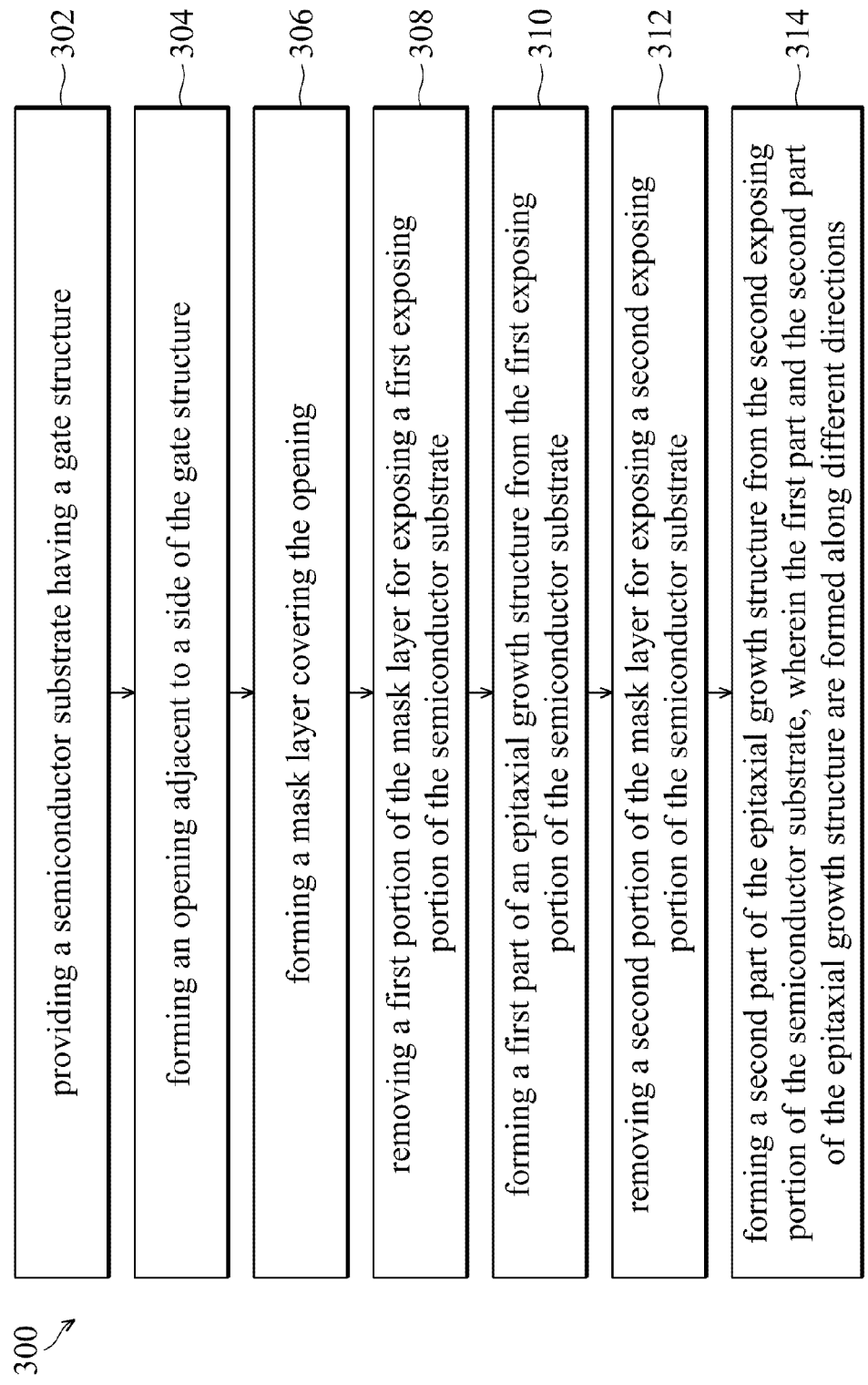
FIG. 3 shows a flowchart illustrating a method for forming a semiconductor device, in accordance with some embodiments of the disclosure.

Other mechanisms for forming the dislocations in a semiconductor device are also provided. FIG. 3 shows a flowchart illustrating a method 300 for forming a semiconductor device, in accordance with some embodiments of the disclosure. The method 300 starts at operation 302, in which a semiconductor substrate having a gate structure is provided. The method 300 continues to operation 304, in which an opening is formed adjacent to a side of the gate structure. The method 300 continues to operation 306, in which a mask layer is formed for covering the opening. The method 300 continues to operation 308, in which a first portion of the mask layer is removed for exposing a first exposing portion of the semiconductor substrate. The method 300 continues to operation 310, in which a first part of an epitaxial growth structure is formed from the first exposing portion of the semiconductor substrate. The method continues to operation 312, in which a second portion of the mask layer is removed for exposing a second exposing portion of the semiconductor substrate. The method continues to operation 314, in which a second part of the epitaxial growth structure is formed from the second exposing portion of the semiconductor substrate. The first part and the second part of the epitaxial growth structure are formed along different directions. The method 300 is simplified for better understanding of the concepts of the disclosure, and additional processes may be provided before, during, and after the method 300 of FIG. 3.

Figure 4A:
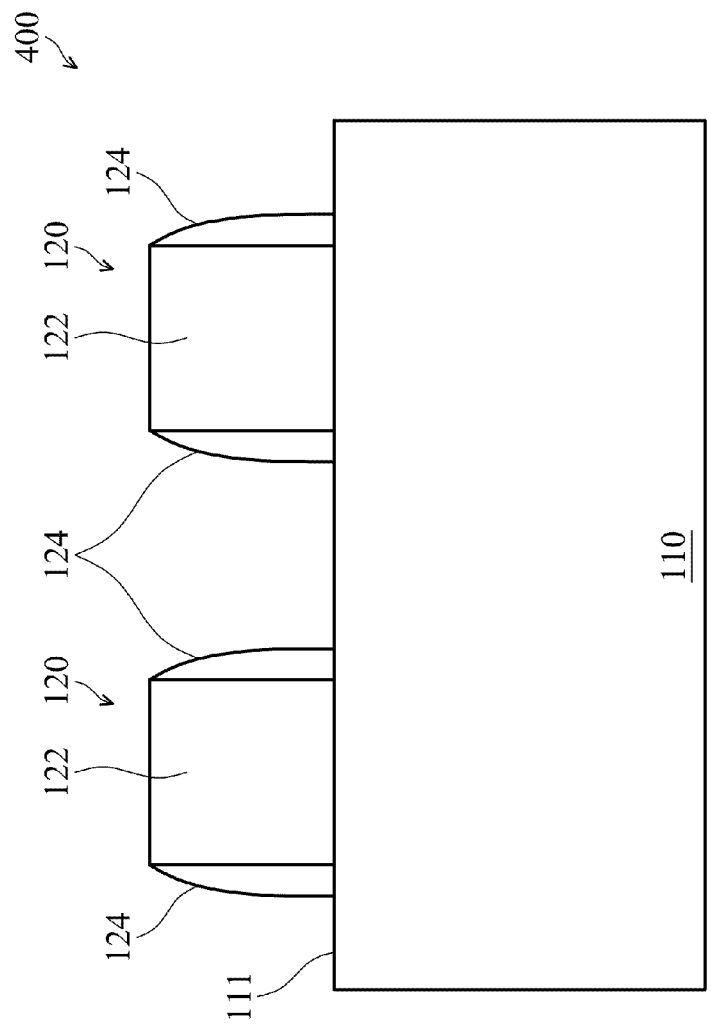
FIGS. 4A to 4G show cross-sectional representations of a semiconductor device at various intermediate stages of fabrication, in accordance with some embodiments of the disclosure.

FIGS. 4A to 4G show cross-sectional representations of intermediate stages of forming a semiconductor device 400, in accordance with some embodiments. In some embodiments, the semiconductor device 400 is fabricated according to the method 300 of FIG. 3. Referring to FIG. 4A, the substrate 110 having the gate structure 120 is provided. In some embodiments, portions of LDD regions (not shown) and pocket regions (not shown) are formed under the gate structure 120.

Figure 4B:
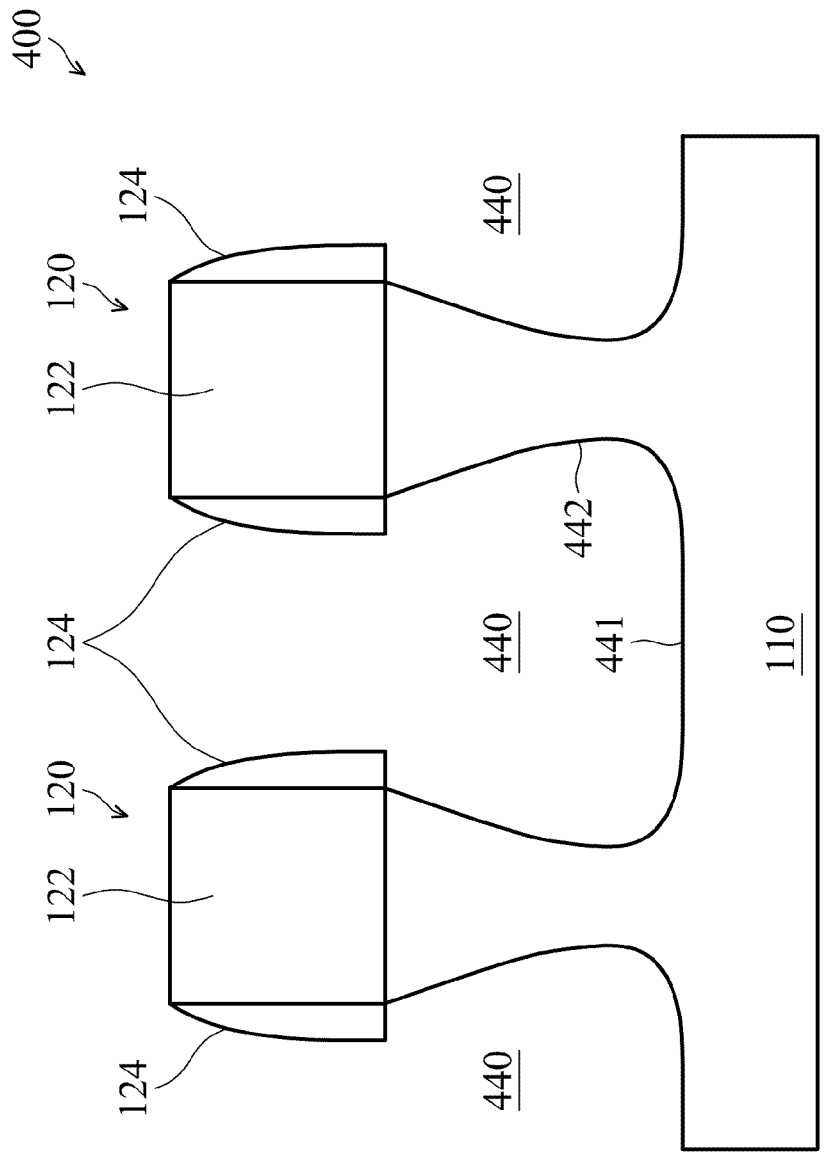

Afterwards, referring to FIG. 4B, openings 440 are formed adjacent to both sides of the gate structure 120, in accordance with some embodiments. For example, the openings 440 are etched in the substrate along the sidewalls of the gate structure 120. In some embodiments, the openings 440 laterally extend under the gate structure 120. The openings 440 include a bottom 441 and sidewalls 442. In some embodiments, the openings 440 have a depth ranging from about 0.1 um to about 10 um. The openings 440 may be formed by a wet etching process or a dry etching process.

Figure 4C:
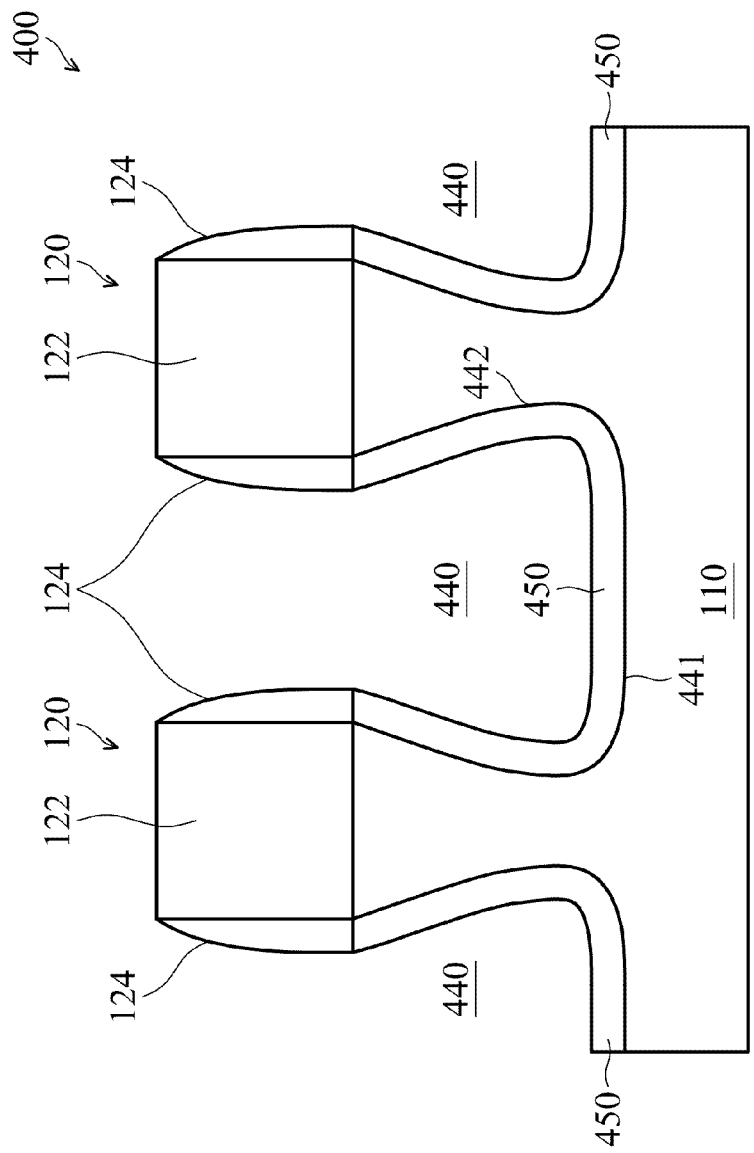

Afterwards, referring to FIG. 4C, a mask layer 450 is formed in the openings 440 for covering the bottom 441 and sidewalls 442 of the openings 440, in accordance with some embodiments. The mask layer 450 may be an oxide layer. In some embodiments, the oxide layer is an intentionally grown layer and is formed by natural oxidation, thermal oxidation, laser oxidation and/or other suitable oxidation methods. Alternatively, the mask layer 450 is a deposited oxide layer that is deposited by CVD, HDPCVD or PVD. The mask layer 450 has a thickness ranging from about 0.1 um to about 10 um.

Figure 4D:
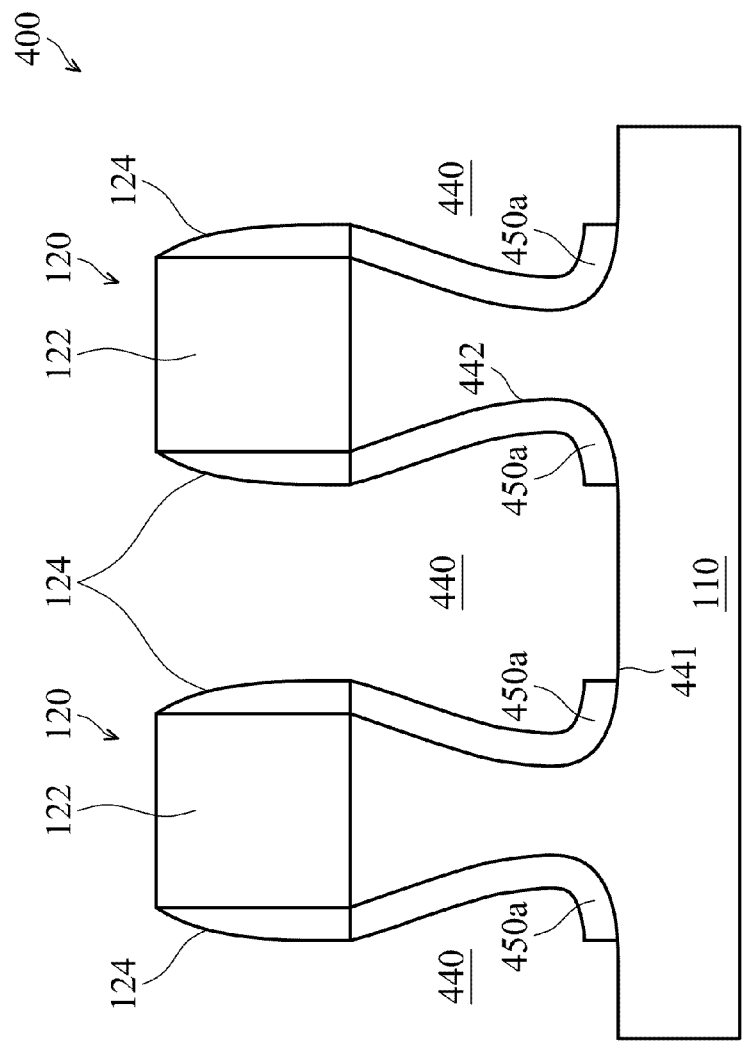

Referring to FIG. 4D, a first portion of the mask layer 450 is removed, in accordance with some embodiments. The removal portion (e.g., the first portion) of the mask layer 450 may be on the bottom 441 of the openings 440 while leaving the mask layer 450*a*. By the removal of the first portion of the mask layer 450, a first exposing portion of the substrate is exposed through the bottom 441 of the openings 440. In some embodiments, the removal of the first portion of mask layer 450 may be accomplished by an anisotropic etching process. The anisotropic etching process may include a dry etching process, such as a plasma etching process or a reactive ion etching (RIE) process. In some embodiments, the boundary of the first exposing portion of the substrate 110 is aligned with the outer sidewalls of the gate spacers 124 when the anisotropic etching process uses the gate structure 120 as a mask.

Figure 4E:
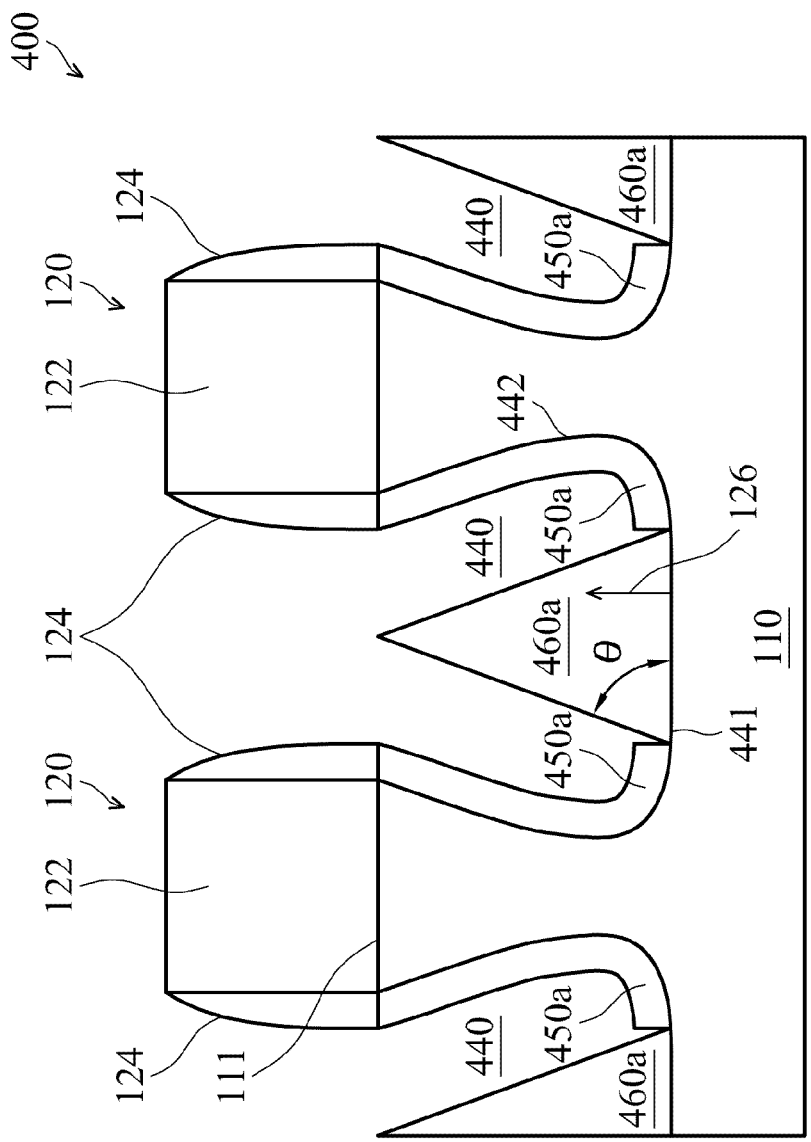

Afterwards, referring to FIG. 4E, a first part of an epitaxial growth structure 460*a* is formed. In some embodiments, the epitaxial growth structure 460*a* is formed by a selective epitaxial process. The selective epitaxial process may be tuned to have a selective rate of depositing an epitaxial material on different materials. In some embodiments, the selective epitaxial growth structure 460*a* is grown starting from the first exposing portion of the substrate 110 (e.g., silicon layer) and along the first direction 126. In the meantime, no epitaxial growth material will be grown starting from mask layer 450*a*.

In some embodiments, the epitaxial growth structure 460*a* includes SiP, SiC, SiCP, or other materials that produce tensile strain on the channel region. In some embodiments, the epitaxial growth structure 460*a* is formed by using a silicon-containing precursor. For example, gases, such as silane, disilane, trisilane, dichlorosilane, etc., are used to form Si—C containing epitaxial material in the epitaxial growth structure 460*a*. In some embodiments, phosphorous-containing gas, such as phosphine ($PH_3$), is used to form Si—P containing epitaxial material in the epitaxial growth structure 460*a*. In other embodiments forming P-type transistors, the epitaxial growth structure 460*a* includes SiGe, that produces compressive strain on the channel region.

In some embodiments, the first part of the epitaxial growth structure 460*a* is grown as a cone shape, a cylinder shape, a trapezoid shape or other suitable shapes. As shown in FIG. 4E, the first part of the epitaxial growth structure 460*a* has a triangular shape in a cross-sectional view. In some embodiments, the epitaxial growth structure 460*a* may include multi-layers or a gradient doping concentration. The angle θ of the first part of the epitaxial growth structure 460*a*, with respect to the main surface 111 of the substrate 110, is in a range from about 0 degrees to about 180 degrees. The first part of the epitaxial growth structure 460*a* may be grown to a thickness that is higher, substantially equal to, or lower than the depth of the openings 440.

In some embodiments, the first part of epitaxial growth structure 460*a* is formed by CVD, e.g., low pressure CVD (LPCVD), atomic layer CVD (ALCVD), ultrahigh vacuum CVD (UHVCVD), reduced pressure CVD (RPCVD), or other suitable CVDs; molecular beam epitaxy (MBE) process or other suitable epitaxial process; or a combination thereof. In some embodiments, the temperature of deposition process is in a range from about 200 degrees Celsius to about 1400 degrees Celsius. In some embodiments, the pressure of the deposition process is in a range from about 0.1 Torr to about 760 Torr. The angle θ and the thickness of the first part of the epitaxial growth structure 460*a* may be tuned by adjusting the precursor, temperature, pressure, or other parameters of the selective epitaxial process.

Figure 4F:
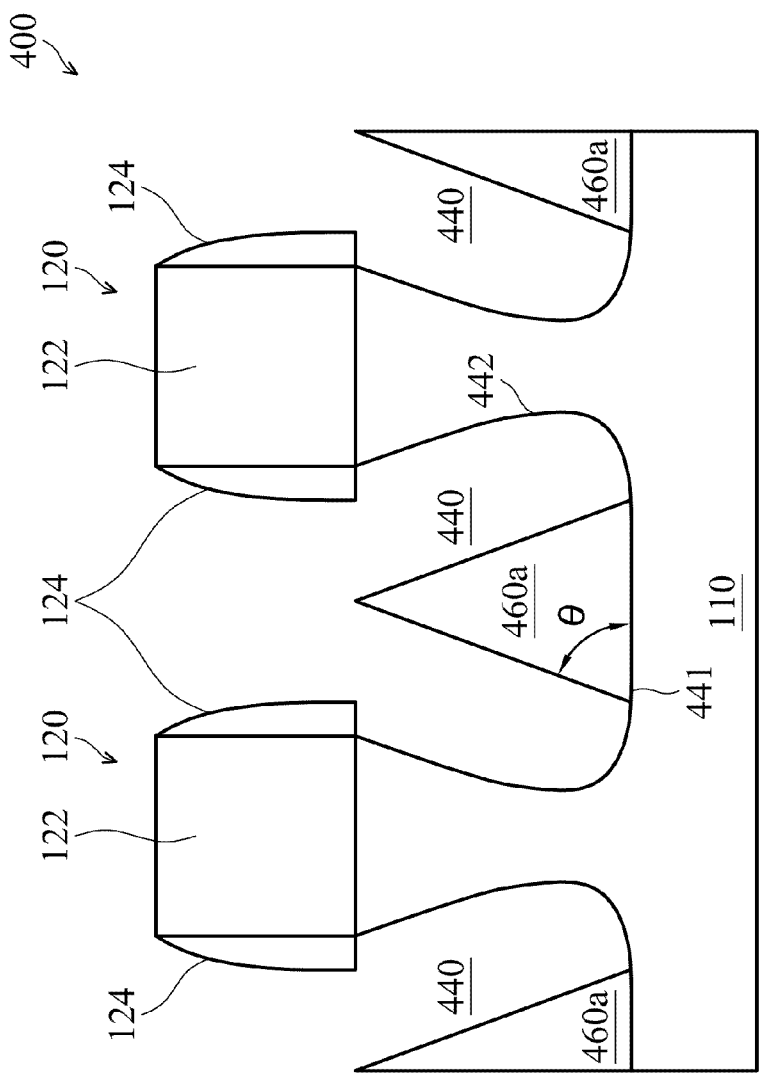

Afterwards, referring to FIG. 4F, a second portion of the mask layer 450*a* is removed, in accordance with some embodiments. In some embodiments, the removed portion (e.g., the second portion) of the mask layer 450*a* may include a portion of the mask layer 450*a* on the sidewalls 442 of the openings 440. In some other embodiments, the whole of the mask layer 450*a* is removed. After the removal of the second portion of the mask layer 450*a*, a second exposing portion of the substrate 110 is exposed through the sidewalls 442 of the openings 440. In some embodiments, the removal of the first portion of mask layer 450 is accomplished by an isotropic etching process. The isotropic etching process may include a wet etching process that uses a liquid etchant.

Figure 4G:
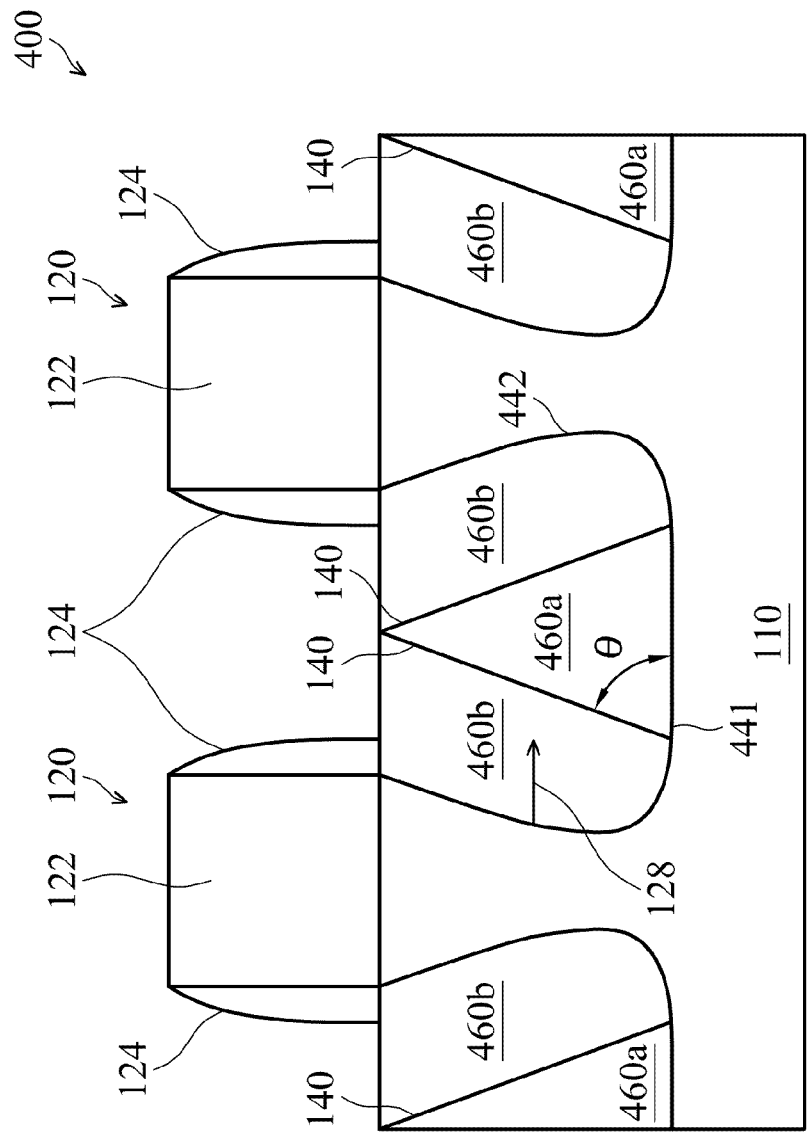

Afterwards, referring to FIG. 4G, a second part of the epitaxial growth structure 460*b* is formed. In some embodiments, the second part of the epitaxial growth structure 460*b* is grown starting from the sidewalls of the openings 440, e.g., from the second exposing portion of the substrate 110 including silicon and along the second direction 128. The second part of the epitaxial growth structure 460*b* may be formed by a selective epitaxial process. In some embodiments, the epitaxial growth structure 460*b* includes SiP, SiC, SiCP, or other materials that produce tensile strain on the channel region. In other embodiments forming P-type transistors, the epitaxial growth structure 460*b* includes SiGe, that produces compressive strain on the channel region. In some embodiments, the second part of the epitaxial growth structure 460*b* is formed of substantially the same material as the first part of the epitaxial growth structure 460*a*. The epitaxial growth structure 460*b* may cover the sidewalls of the first part of the epitaxial growth structure 460*a*. For example, the second part of the epitaxial growth structure 460*b* fills the openings 440. In some embodiments, the second part of the epitaxial growth structure 460*b* is grown to have a top surface that is higher than or substantially equal to the top of the first part of the epitaxial growth structure 460*a*.

In some embodiments, the second part of epitaxial growth structure 460*b* is formed by CVD, e.g., low pressure CVD (LPCVD), atomic layer CVD (ALCVD), ultrahigh vacuum CVD (UHVCVD), reduced pressure CVD (RPCVD), or other suitable CVDs; molecular beam epitaxy (MBE) process or another suitable epitaxial process; or a combination thereof. In some embodiments, the temperature of the deposition process is in a range from about 200 degrees Celsius to about 1400 degrees Celsius. In some embodiments, the pressure of the deposition process is in a range from about 0.1 Torr to about 760 Torr.

In some embodiments, the silicon-containing epitaxial structure (not shown) is further formed near the main surface 111 of the substrate 110. The silicon-containing epitaxial structure may be formed by etching recessed regions in each of the stressor regions 230 and then epitaxial depositing a silicon-containing epitaxial material into the recessed regions. Alternatively, the profile of the silicon-containing epitaxial structure may be directly formed in the selective epitaxial processes as shown in FIGS. 4E and 4G.

The silicon-containing epitaxial material may include SiC, SiCP, SiP or other materials that produce tensile strain on the channel region. Alternatively, the silicon-containing material may include SiGe or other materials that produce compressive strain on the channel region. The dislocations 140 may propagate into silicon-containing epitaxial structure.

Since the first part and the second part of the epitaxial growth structures 460a and 460b, respectively, are grown along the first and second directions 126 and 128, the dislocations 140 are formed between the first part and the second part of the epitaxial growth structures 460a and 460b. In some embodiments, the dislocations 140 are formed along the sidewalls of the first part of the epitaxial growth structure 460a.

Figure 5:
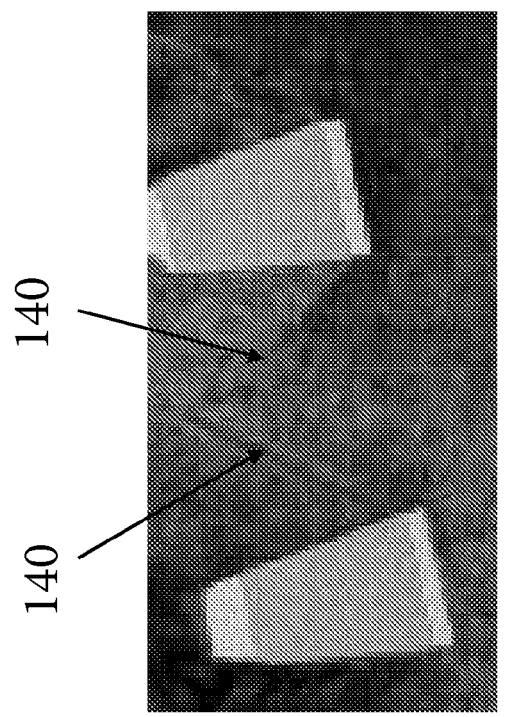
FIG. 5 shows a transmission electronic microscopy image of dislocations in a semiconductor device, in accordance with some embodiments of the disclosure.

FIG. 5 shows a transmission electronic microcopy (TEM) image of dislocations in a semiconductor device, in accordance with some embodiment of the disclosure. In this TEM image, two dislocations 140, as indicated by the arrows, in the epitaxial growth structure are clearly seen.

In these embodiments, since the dislocations 140 are formed only along the sidewalls of the first part of the epitaxial growth structure 460a, a stable dislocation profile is provided. Excess dislocations in other directions can be prevented. In addition, there is no need to perform the PAI process and annealing process as well as no need to form the stress film, reducing fabrication complexity. Furthermore, there is no longer need to worry about the pinchoff points that could be removed if the silicon-containing epitaxial structure is needed. The silicon-containing epitaxial structure may be directly formed during the formation of the first and second parts of the epitaxial growth structure 460a and 460b.

Embodiments of mechanisms for forming a semiconductor device having a dislocation in source/drain regions are provided. The dislocation could be formed by epitaxial processes, without being induced by stress and thermal treatment. Therefore, the stable dislocation profile and easy fabrication are achieved.

In accordance with some embodiments, a method for manufacturing a semiconductor device is provided. The method includes providing a semiconductor substrate having a gate stack. The method also includes forming an opening adjacent to a side of the gate stack. The method further includes forming a first part of an epitaxial growth structure in the opening. In addition, the method includes forming a second part of the epitaxial growth structure in the opening. The first part and the second part of the epitaxial growth structure are formed along different directions.

In accordance with some embodiments, a method for manufacturing a semiconductor device is provided. The method includes providing a semiconductor substrate having a gate stack. The method also includes forming an opening adjacent to a side of the gate stack. The method further includes forming a mask layer covering a bottom and sidewalls of the opening. In addition, the method includes removing a first portion of the mask layer for exposing a first exposing portion of the semiconductor substrate. The first exposing portion is exposed through the bottom of the opening. The method includes forming a first part of an epitaxial growth structure from the first exposing portion of the semiconductor substrate. The method also includes removing a second portion of the mask layer for exposing a second exposing portion of the semiconductor substrate. The method further includes forming a second part of the epitaxial growth structure from the second exposing portion of the semiconductor substrate and covering sidewalls of the first part of the epitaxial growth structure.

In accordance with some embodiments, a method for manufacturing a semiconductor device is provided. The method includes providing a semiconductor substrate having a gate structure and an opening adjacent to a side of the gate structure. The method also includes forming a mask layer covering the opening. The method further includes performing an anisotropic etching process on the mask layer, by using the gate structure as a mask, for exposing a portion of the semiconductor substrate through a bottom of the opening. In addition, the method includes performing a first selective epitaxial process on the exposed portion of the semiconductor substrate. The first selective epitaxial process comprises depositing substantially no epitaxy material on the mask layer. The method includes performing an isotropic etching process for removing the remaining mask layer. The method also includes performing a second selective epitaxial process for filling the opening.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for manufacturing a semiconductor device, comprising:
   providing a semiconductor substrate having a gate structure;
   forming an opening adjacent to a side of the gate structure;
   forming a mask layer covering the opening, wherein the mask layer exposes a first exposing portion of the semiconductor substrate;
   forming a first part of an epitaxial growth structure in the opening, wherein the first part of the epitaxial growth structure gradually becomes narrower along a direction from a bottom towards a top of the first part of the epitaxial growth structure; and forming a second part of the epitaxial growth structure in the opening, wherein the first part and the second part of the epitaxial growth structure are formed along different directions, and the first part and the second part of the epitaxial growth structure is laterally arranged with respect to the first part of the epitaxial growth structure and a sidewall of the opening.

2. The method as claimed in claim 1, wherein the mask layer is an oxide layer.

3. The method as claimed in claim 1, wherein the mask layer is formed by natural oxidation, thermal oxidation, laser oxidation or a combination thereof.

4. The method as claimed in claim 1, wherein the first exposing portion of the semiconductor substrate is exposed through a bottom of the opening.

5. The method as claimed in claim 1, wherein the forming of the first part of the epitaxial growth structure comprises a selective epitaxial process, wherein the first part of the epitaxial growth structure is formed from the first exposing portion of the semiconductor substrate in the selective epitaxial process.

6. The method as claimed in claim 1, further comprising removing the remaining mask layer for exposing a second exposing portion of the semiconductor substrate, after the forming of the first part of the epitaxial growth structure.

7. The method as claimed in claim 6, wherein the second exposing portion of the semiconductor substrate is exposed through sidewalls of the opening.

8. The method as claimed in claim 6, wherein the forming of the second part of the epitaxial growth structure comprises a selective epitaxial process, wherein the second part of the epitaxial growth structure is formed from the second exposing portion of the semiconductor substrate in the selective epitaxial process.

9. The method as claimed in claim 1, wherein the first part of the epitaxial growth structure and the second part of the epitaxial growth structure are formed along a first direction and a second direction, respectively, wherein the first direction and the second direction are perpendicular to a bottom surface and sidewalls of the opening, respectively.

10. The method as claimed in claim 1, wherein sidewalls of the first part and the second part of the epitaxial growth structure are in direct contact with each other.

11. A method for manufacturing a semiconductor device, comprising:

providing a semiconductor substrate having a gate structure;

forming an opening adjacent to a side of the gate structure;

forming a mask layer covering a bottom and sidewalls of the opening;

removing a first portion of the mask layer for exposing a first exposing portion of the semiconductor substrate, wherein the first exposing portion is exposed through the bottom of the opening;

forming a first part of an epitaxial growth structure from the first exposing portion of the semiconductor substrate, wherein the first part of the epitaxial growth structure gradually becomes narrower along a direction from a bottom towards a top of the first part of the epitaxial growth structure;

removing a second portion of the mask layer for exposing a second exposing portion of the semiconductor substrate; and forming a second part of the epitaxial growth structure from the second exposing portion of the semiconductor substrate, wherein the second part of the epitaxially growth structure is laterally arranged with respect to the first part of the epitaxial growth structure and a sidewall of the opening.

12. The method as claimed in claim 11, wherein the epitaxial growth structure is formed of an epitaxy material including SiC, SiP, SiCP or a combination thereof.

13. The method as claimed in claim 11, wherein the epitaxial growth structure is formed of an epitaxy material including SiGe.

14. The method as claimed in claim 11, wherein each sidewall of the first part of the epitaxial growth structure has an angle ranging from about 0 degrees to about 180 degrees, the angle being measured with respect to an axis parallel to a surface of the semiconductor substrate.

15. The method as claimed in claim 11, wherein the first exposing portion of the semiconductor substrate is exposed through the bottom of the opening, and the second exposing portion of the semiconductor substrate is exposed through the sidewalls of the opening.

16. The method as claimed in claim 11, wherein the removal of the first portion of the mask layer comprises an anisotropic etching process.

17. The method as claimed in claim 11, wherein the removal of the second portion of the mask layer comprises an isotropic etching process.

18. The method as claimed in claim 11, wherein dislocations are formed along the sidewalls of the first part of the epitaxial growth structure.

19. The method as claimed in claim 18, wherein at least one of the dislocation extends along a direction substantially parallel to an interface between the first part and the second part of the epitaxial growth structure.

20. A method for manufacturing a semiconductor device, comprising:

providing a semiconductor substrate having a gate structure and an opening adjacent to a side of the gate structure;

forming a mask layer covering the opening;

performing an anisotropic etching process on the mask layer, by using the gate structure as a mask, for exposing a portion of the semiconductor substrate through a bottom of the opening;

performing a first selective epitaxial process to form a first semiconductor material on the exposed portion of the semiconductor substrate, wherein the first part of the epitaxial growth structure gradually becomes narrower along a direction from a bottom towards a top of the first part of the epitaxial growth structure;

performing an isotropic etching process for removing the remaining mask layer; and performing a second selective epitaxial process to form a second semiconductor material for filling the opening, wherein the second semiconductor material is laterally arranged with respect to the first part of the epitaxial growth structure and a sidewall of the opening.

21. The method as claimed in claim 20, wherein the epitaxial growth direction of the first selective epitaxial process is different from the epitaxial growth direction of the second selective epitaxial process.

* * * * *